US012740278B2

(12) United States Patent
Liu et al.

(10) Patent No.: US 12,740,278 B2
(45) Date of Patent: Sep. 15, 2026

(54) PIXEL ARRANGEMENT STRUCTURE, METAL MASK, DISPLAY PANEL AND DISPLAY APPARATUS

(71) Applicant: Everdisplay Optronics (Shanghai) Co., Ltd., Shanghai (CN)

(72) Inventors: Yingjun Liu, Shanghai (CN); Xu Zeng, Shanghai (CN); Wei Sang, Shanghai (CN); Kaikai Chen, Shanghai (CN); Jun Hu, Shanghai (CN); Chung Che Tsou, Shanghai (CN); Yinan Liang, Shanghai (CN); Shaodong Ma, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/699,905

(22) PCT Filed: Mar. 29, 2023

(86) PCT No.: PCT/CN2023/084605
§ 371 (c)(1),
(2) Date: Apr. 10, 2024

(87) PCT Pub. No.: WO2024/159606
PCT Pub. Date: Aug. 8, 2024

(65) Prior Publication Data
US 2025/0344591 A1 Nov. 6, 2025

(30) Foreign Application Priority Data
Jan. 30, 2023 (CN) ......................... 202310091965.5

(51) Int. Cl.
*H10K 59/35* (2023.01)
*H10K 71/16* (2023.01)

(52) U.S. Cl.
CPC ......... *H10K 59/352* (2023.02); *H10K 59/353* (2023.02); *H10K 71/166* (2023.02)

(58) Field of Classification Search
CPC ... H10K 59/352; H10K 59/353; H10K 71/166
See application file for complete search history.

(56) References Cited

U.S. PATENT DOCUMENTS 11,024,221 B2 * 6/2021 Zhang .................. G09G 3/2074
2009/0121983 A1 5/2009 Sung et al.
(Continued)

FOREIGN PATENT DOCUMENTS

CN 104616597 A 5/2015
CN 205487172 U 8/2016
(Continued)

OTHER PUBLICATIONS

International Search Report dated Oct. 9, 2023 of International Application No. PCT/CN2023/084605.
(Continued)

*Primary Examiner* — Thao P Le
(74) *Attorney, Agent, or Firm* — Qinghong Xu

(57) ABSTRACT

Provided are a pixel arrangement structure, a metal mask, a display panel and a display apparatus, the structure includes: a plurality of first and second pixel units, the first pixel unit includes one first sub-pixel, one second sub-pixel and one third sub-pixel; the second pixel unit includes one first sub-pixel, one second sub-pixel and two third sub-pixels; an aperture area of the third sub-pixel in the first pixel unit is greater than that of each third sub-pixel in the second pixel unit, a first spacing exists between two third sub-pixels in the second pixel unit, a second spacing exists between the first and second sub-pixels in the second pixel unit, the first spacing is greater than the second spacing; the third sub-pixel located in the first pixel unit and two adjacent third
(Continued)

sub-pixels belonging to different second pixel units correspond to a same aperture region of a metal mask.

20 Claims, 11 Drawing Sheets

(56) References Cited

U.S. PATENT DOCUMENTS

| | | | | |
|---|---|---|---|---|
| 2014/0246654 | A1 | 9/2014 | Huang et al. | |
| 2017/0345353 | A1* | 11/2017 | Lin | G09G 3/2003 |
| 2019/0011830 | A1 | 1/2019 | Ji | |
| 2019/0096961 | A1* | 3/2019 | Jin | H10K 59/353 |
| 2023/0165099 | A1* | 5/2023 | Qiu | H10K 59/352<br>257/89 |
| 2023/0337498 | A1* | 10/2023 | Yang | H10K 59/353 |
| 2024/0265860 | A1* | 8/2024 | Sang | H10K 59/352 |

FOREIGN PATENT DOCUMENTS

| | | | |
|---|---|---|---|
| CN | 107146804 | A | 9/2017 |
| CN | 108511481 | A | 9/2018 |
| CN | 110429102 | A | 11/2019 |
| CN | 110444569 | A | 11/2019 |
| CN | 113540203 | A | 10/2021 |

OTHER PUBLICATIONS

1st Office Action dated Jul. 5, 2023 for Chinese Application No. 202310091965.5.

* cited by examiner

PIXEL ARRANGEMENT STRUCTURE, METAL MASK, DISPLAY PANEL AND DISPLAY APPARATUS

CROSS-REFERENCE TO RELATED APPLICATION

The present disclosure is an US national phase of International Application No. PCT/CN2023/084605, filed on Mar. 29, 2023, which is based upon and claims priority to Chinese Patent Application No. 202310091965.5, filed on Jan. 30, 2023, and the entire content of which is incorporated herein by reference.

TECHNICAL FIELD

The present disclosure relates to the field of display technology, and particularly, to a pixel arrangement structure, a metal mask, a display panel and a display apparatus.

BACKGROUND

With the development of display technology, the display effect of Organic Light Emitting Diode (OLED) panel has become increasingly important and demanding. At present, the commonly used pixel design is to combine red (R), green (G), and blue (B) sub-pixels to form a pixel unit, and the display light emitting area is formed by performing array filling on the above pixel units.

The manufacturing process of the OLED panel usually adopts Fine Metal Mask (FMM) to prepare red, green and blue light emitting layers, which constitute red, green and blue sub-pixels. However, in the manufacturing process of FMM, the aperture region of the sub-pixel is limited since a certain amount of raw material needs to be reserved as a bridging part (Rib) between individual aperture regions, which affects the aperture ratio of pixels, and in turn adversely affects the brightness and service life of the entire display panel, making it difficult to improve the brightness and service life of the display panel. Therefore, how to increase the aperture ratio of the pixels in the OLED panel so as to improve the brightness and service life of the OLED panel is a problem currently faced.

It should be noted that the information disclosed in the above background section is only used for enhancing the understanding of the background of the present disclosure, and therefore may include information that does not constitute prior art known to those of ordinary skill in the art.

SUMMARY

In view of this, the present disclosure provides a pixel arrangement structure, a metal mask, a display panel and a display apparatus, which are beneficial for improving the aperture ratio of pixels in the OLED panel, thereby facilitating the improvement of the brightness and service life of the OLED panel.

According to one aspect of the present disclosure, there is provided a pixel arrangement structure, including: a plurality of first pixel units and a plurality of second pixel units, where the first pixel units and the second pixel units are arranged alternately in a row direction, each of the first pixel units includes one first sub-pixel, one second sub-pixel and one third sub-pixel; and each of the second pixel units includes one first sub-pixel, one second sub-pixel and two third sub-pixels; and an aperture area of the third sub-pixel in the first pixel unit is greater than an aperture area of each third sub-pixel in the second pixel unit, a first spacing exists between the two third sub-pixels in the second pixel unit, a second spacing exists between the first sub-pixel and the second sub-pixel in the second pixel unit, the first spacing is greater than the second spacing; and the third sub-pixel located in the first pixel unit and two adjacent third sub-pixels belonging to different second pixel units correspond to a same aperture region of a metal mask.

Optionally, the aperture area of the single third sub-pixel in the first pixel unit is greater than or equal to a sum of the aperture areas of the two third sub-pixels in the second pixel unit.

Optionally, the aperture areas of the two third sub-pixels in the second pixel unit are equal, and the aperture area of the single third sub-pixel in the first pixel unit is equal to the sum of the aperture areas of the two third sub-pixels in the second pixel unit.

Optionally, the two third sub-pixels in the second pixel unit have equal aperture widths along the row direction and equal aperture widths along a column direction; the third sub-pixel in the first pixel unit and the third sub-pixels in the second pixel unit have equal aperture widths along the column direction, and an aperture width of the third sub-pixel in the first pixel unit along the row direction is twice the aperture width of the third sub-pixel in the second pixel unit along the row direction.

Optionally, the third sub-pixels corresponding to the same aperture region of the metal mask are one group of the third sub-pixels, and a spacing between adjacent two groups of the third sub-pixels is equal to a spacing between the two third sub-pixels in a same second pixel unit.

Optionally, the third sub-pixels in two adjacent rows are arranged in a same manner or in an interleaved manner.

Optionally, a third spacing exists between the third sub-pixels in a same group, and the third spacing is smaller than the second spacing.

Optionally, a first symmetry line of the third sub-pixel in the first pixel unit overlaps with a second symmetry line of the third sub-pixels in the second pixel unit located in another adjacent row and in a same column.

Optionally, the first sub-pixels in the first pixel unit and the second pixel unit adjacent to each other in a same row are arranged mirror-symmetrically with respect to a third symmetry line, the second sub-pixels in the first pixel unit and the second pixel unit adjacent to each other in a same row are arranged mirror-symmetrically with respect to a fourth symmetry line, the third symmetry line overlaps with the fourth symmetry line; and a spacing between sub-pixels of a same color in a same row is smaller than a spacing between sub-pixels of different colors in the same row.

Optionally, the two third sub-pixels in the second pixel unit share an anode layer so that the two third sub-pixels are connected to a same data signal line via the anode layer.

Optionally, the first spacing is less than 100 μm.

Optionally, the third sub-pixel is a blue sub-pixel.

According to another aspect of the present disclosure, there is provided a metal mask for manufacturing any one of the above pixel arrangement structures, and the metal mask includes:

a plurality of aperture regions, each corresponding to sub-pixels of a same color; where one group of third sub-pixels located within a same aperture region includes one third sub-pixel in the first pixel unit and two third sub-pixels belonging to different second pixel units.

According to another aspect of the present application, there is provided a display panel, and the display panel includes any one of the above pixel arrangement structures.

According to another aspect of the present application, there is provided a display apparatus, and the display apparatus includes the above display panel.

The beneficial effects of the present disclosure compared to the related art are as follows.

The pixel arrangement structure provided by the present disclosure is formed by arranging two kinds of pixel units alternately, and the number and structure of the third sub-pixels in the two kinds of pixel units are different. The aperture area of the third sub-pixel in the first pixel unit is greater than the aperture area of each third sub-pixel in the second pixel unit. The same group of adjacent third sub-pixels corresponding to the two pixel units may share the same aperture region of the metal mask, which is beneficial for improving the aperture ratio of pixels in the OLED panel, thereby facilitating the improvement of the brightness and service life of the OLED panel.

The advantages of the above metal mask, display panel and display apparatus over the related art are the same as those of the above pixel arrangement structure, and will not be repeated here.

In addition to the technical problems solved by the embodiments of the present disclosure described above, the technical features constituting the technical solutions and the beneficial effects brought out by the technical features of these technical solutions, other technical problems that may be solved by the pixel arrangement structure, metal mask, display panel and display apparatus provided by the embodiments of the present disclosure, other technical features contained in the technical solutions and the beneficial effects brought out by these technical features will be further described in detail in the specific implementation manners.

BRIEF DESCRIPTION OF THE DRAWINGS

The accompanying drawings herein, which are incorporated in and constitute a part of this specification, illustrate embodiments consistent with the present disclosure and are used in conjunction with the specification to explain the principles of the present disclosure. Obviously, the drawings in the following description are only some embodiments of the present disclosure. For those of ordinary skill in the art, other drawings can also be obtained from these drawings without paying creative effort.

DETAILED DESCRIPTION

Figure 1:
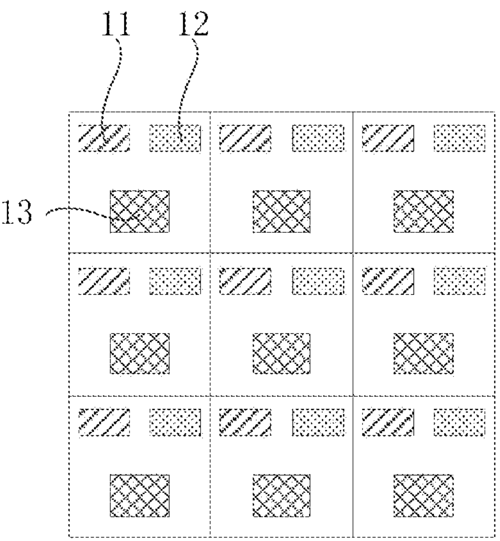
FIG. 1 is a schematic diagram of a pixel arrangement structure in the related art.

Exemplary implementation manners will now be described more comprehensively with reference to the accompanying drawings. However, the exemplary implementation manners may be implemented in various forms and should not be construed as being limited to the implementation manners set forth herein. Rather, these implementation manners are provided so that the present disclosure will be thorough and complete, and the concept of the exemplary implementation manners may be comprehensively conveyed to those skilled in the art. The described features, structures, or characteristics may be combined in any suitable manner in one or more implementation manners. In the following description, numerous specific details are provided in order to provide a thorough understanding of the implementation manners of the present disclosure. However, one skilled in the art will appreciate that the technical solutions of the present disclosure may be practiced without one or more of the specific details, or that other methods, materials, apparatuses, etc. may be adopted. In other instances, well-known technical solutions are not shown or described in detail to avoid obscuring aspects of the present disclosure. The same reference numerals in the drawings denote the same or similar structures, and thus their repetitive descriptions will be omitted.

The terms "one", "a/an", "the", "said" and "at least one" are used to indicate the existence of one or more elements/components/etc.; and the terms "comprising", "having" and "providing with" are used in an open-ended inclusion and refer to the existence of additional elements/components/etc. in addition to the listed elements/components/etc.

FIG. 1 discloses a pixel arrangement structure in the related art, i.e., the common Real arrangement structure. Referring to FIG. 1, in this arrangement structure, red sub-pixels 11, green sub-pixels 12 and blue sub-pixels 13 are arranged in a matrix of inverted triangles. This kind of design may have the problem that the aperture ratio of the pixel is low due to the non-dense arrangement of the three colors, which in turn leads to a low total aperture light emitting area, which ultimately affects the product lifetime.

Figure 2:
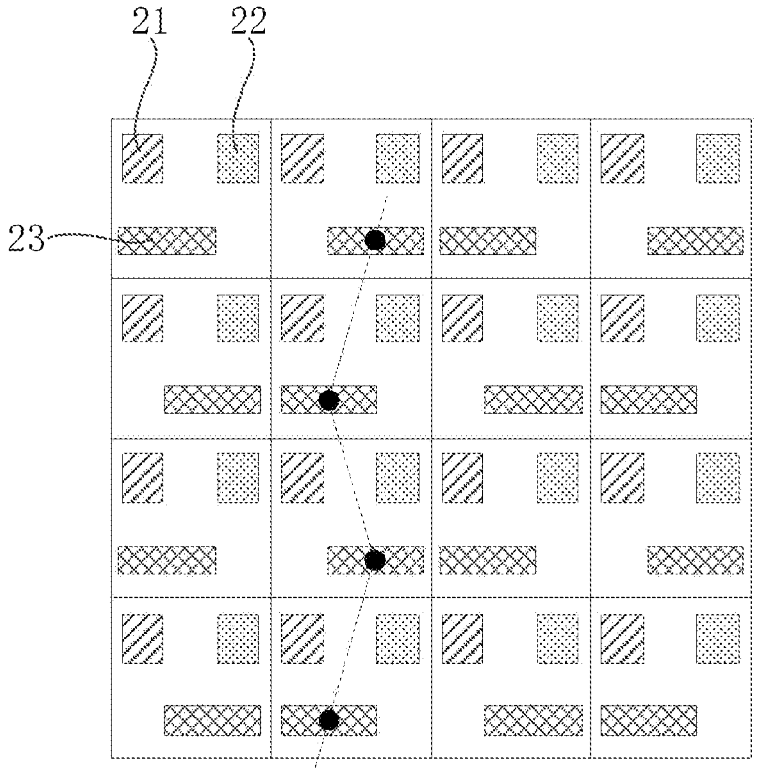
FIG. 2 is a schematic diagram of another pixel arrangement structure in the related art.

FIG. 2 is another pixel arrangement structure in the related art, which includes red sub-pixels 21, green sub-pixels 22 and blue sub-pixels 23. This type of arrangement structure is usually applied to large-size display apparatuses such as tablet computers. This type of arrangement structure does not perform well in the monochrome display of the blue sub-pixels 23. Specifically, referring to FIG. 2, jagged lines (referring to the dotted connecting line in FIG. 2) will appear when the arrangement structure is displaying vertical lines of blue sub-pixel 23 in monochrome due to the differences in the relative positions of the centers of blue sub-pixels 23 among different rows. Further, the jagged display problem will be exacerbated due to the relatively large spacing between the pixels of a large-size display.

Figure 3:
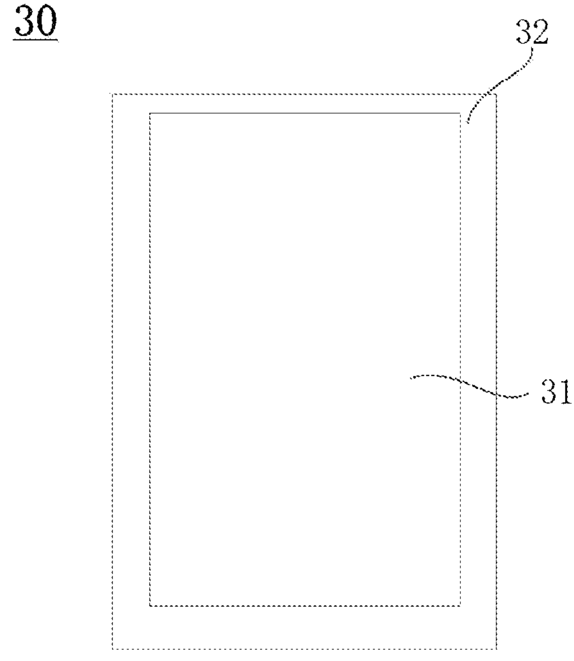
FIG. 3 is a schematic structural diagram of a display panel disclosed in an embodiment of the present disclosure.

As shown in FIG. 3, an embodiment of the present disclosure discloses a display panel 30. The display panel 30 includes a display area 31 and a non-display area 32, and the display area 31 displays images through a plurality of sub-pixels. Specifically, in some embodiments, the display area 31 may be rectangular, and the non-display area 32 is arranged around the display area 31. The shapes and arrangements of the display area 31 and the non-display area 32 include but are not limited to the above-mentioned example. For example, when the display panel 30 is used for a wearable device worn on the user, the display area 31 may have a circular shape like a watch; when the display substrate is used for display on the vehicle, the display area 31 and the non-display area 32 may adopt, for example, circular, polygonal or other shapes. The display area 31 is provided with a plurality of sub-pixels emitting light of different colors, for example, white light can be formed by mixing red light, green light, and blue light. The sub-pixel is represented as the smallest unit for emitting light (e.g., the smallest addressable unit of the display panel 30).

The display panel 30 provided in the embodiment of the present disclosure may be an organic light emitting display panel, and the sub-pixel at least include an anode, a cathode, and a light emitting layer located between the anode and the cathode. The pixel drive circuit applies a voltage between the anode and the cathode to stimulate carrier migration and act on the light emitting layer to emit light. Specifically, the light emitting layer includes at least a hole transport layer, an organic material layer, and an electron transport layer, with the anode used for providing holes or electrodes for transporting holes to the hole transport layer, and the cathode used for providing electrons or transporting electrons to the organic material layer.

In order to solve the aforementioned problems of low pixel aperture ratio and jagged display, an embodiment of the present disclosure discloses a pixel arrangement structure. In the embodiment of the present disclosure, the pixel arrangement structure includes first sub-pixels, second sub-pixels and third sub-pixels that emit light of different colors. The first sub-pixel, the second sub-pixel and the third sub-pixel may be one of a blue sub-pixel, a red sub-pixel and a green sub-pixel, respectively, constituting a pixel that showing white light. In some other embodiments, the first sub-pixels, the second sub-pixels and the third sub-pixels may be other colors than red, green and blue, which is not limited here.

Figure 4:
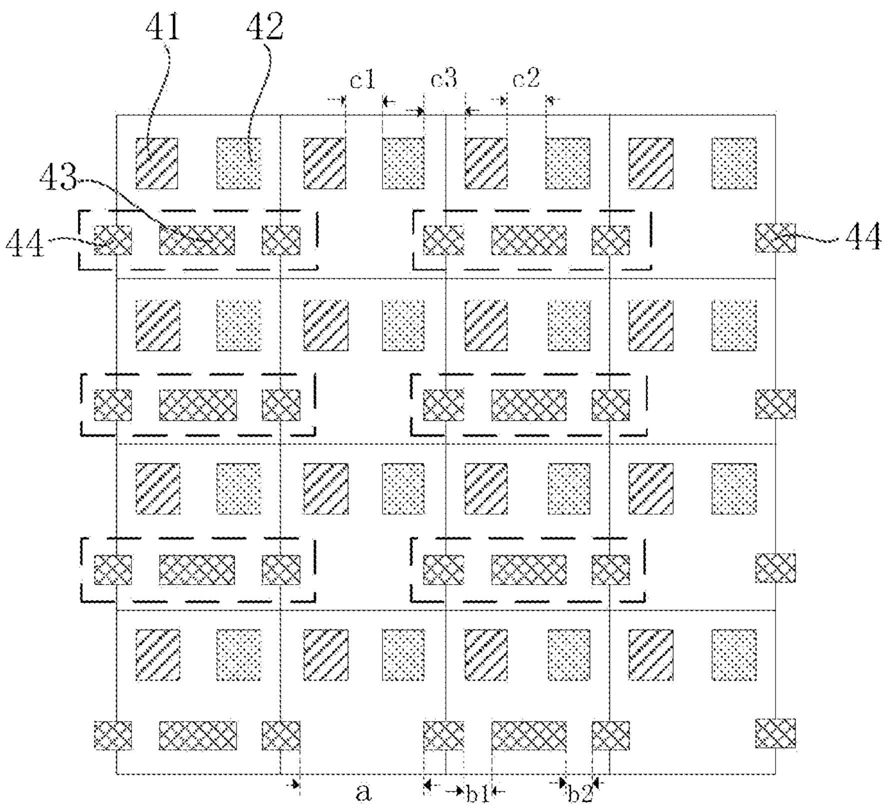
FIG. 4 is a schematic diagram of a pixel arrangement structure disclosed in an embodiment of the present disclosure.
Figure 5:
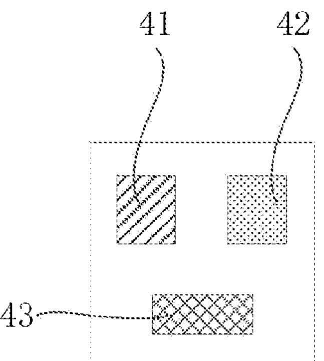
FIG. 5 is a schematic diagram of a first pixel unit in a pixel arrangement structure disclosed in an embodiment of the present disclosure.
Figure 6:
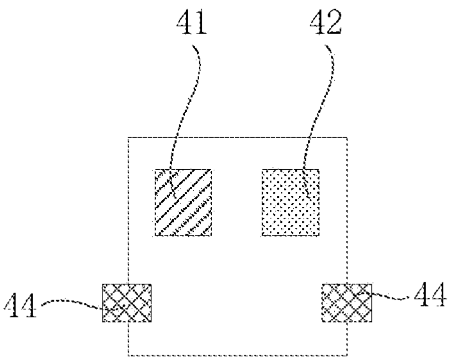
FIG. 6 is a schematic diagram of a second pixel unit in a pixel arrangement structure disclosed in an embodiment of the present disclosure.

As shown in FIG. 4, in the embodiment, the pixel arrangement structure includes a plurality of first pixel units and a plurality of second pixel units. The above first pixel units and the above second pixel units are arranged alternately in the row direction. Referring to FIG. 5, each of the first pixel units includes one first sub-pixel 41, one second sub-pixel 42 and one third sub-pixel 43. Referring to FIG. 6, each of the second pixel units includes one first sub-pixel 41, one second sub-pixel 42 and two third sub-pixels 44. The first sub-pixels in the first pixel unit and the second pixel unit are sub-pixels of the same color, the second sub-pixels are also sub-pixels of the same color, and the third sub-pixels are also sub-pixels of the same color.

The aperture areas of the first sub-pixel 41 and the second sub-pixel 42 in the above-mentioned first pixel unit and second pixel unit may be equal, and the shape of the apertures may also be the same. The aperture areas of the third sub-pixels in the first pixel unit and the second pixel unit are not equal, and the shape of the apertures may be the same. The aperture areas of the two third sub-pixels in the above second pixel unit are equal. A pixel array is formed by performing array filling on the first pixel units and the second pixel units. Exemplarily, the row direction and the column direction in the present disclosure may refer to the row direction and the column direction of the pixel array.

In this embodiment, the above pixel arrangement structure includes a plurality of virtual quadrilaterals. The plurality of virtual quadrilaterals is arranged in a manner of sharing edges. The first sub-pixel 41, the second sub-pixel 42 and the third sub-pixel in the first pixel unit are all located inside the above virtual quadrilateral. The first sub-pixel 41 and the second sub-pixel 42 in the second pixel unit are located inside the virtual quadrilateral, and the two third sub-pixels in the second pixel unit are respectively located on two opposite virtual edges of the virtual quadrangle. That is, the two third sub-pixels in the second pixel unit may be arranged along two ends of the virtual quadrilateral in the row direction. The third sub-pixel in the first pixel unit may be arranged centrally in the virtual quadrangle in the row direction.

Referring to FIG. 4, in this embodiment, the aperture area of the third sub-pixel 43 in the above first pixel unit is greater than the aperture area of each third sub-pixel 44 in the second pixel unit. There is a first spacing a between the two third sub-pixels in the above second pixel unit. There is a second spacing c1 between the first sub-pixel 41 and the second sub-pixel 42 in the above second pixel unit. There is a fourth spacing c2 between the first sub-pixel 41 and the second sub-pixel 42 in the first pixel unit. The above-mentioned first spacing a is greater than the abovementioned second spacing c1. The above-mentioned second spacing c1 is equal to the fourth spacing c2. In this way, the arrangement of the first sub-pixel 41 and the second sub-pixel 42 can be more compact, which is beneficial for improving the aperture ratio of the first sub-pixel 41 and the second sub-pixel 42. For the adjacent first pixel unit and second pixel unit, there is a fifth spacing c3 between the second sub-pixel 42 in the first pixel unit and the first sub-pixel 41 in the second pixel unit. In an optional embodiment, the fifth spacing c3, the second spacing c1 and the fourth spacing c2 are all equal.

The aperture area of the single third sub-pixel in the first pixel unit may be greater than or equal to a sum of the aperture areas of the two third sub-pixels in the above second pixel unit, which is beneficial for increasing the aperture area of the third sub-pixels in the pixel array, thereby improving the aperture ratio of the pixels in the OLED panel. In a preferred embodiment, the aperture area of the single third sub-pixel in the above first pixel unit is equal to the sum of the aperture areas of the two third sub-pixels in the second pixel unit.

Further, as a preferred embodiment, the aperture width of the third sub-pixel 43 in the first pixel unit along the row direction is twice the aperture width of a single third sub-pixel 44 in the second pixel unit along the row direction. The aperture widths of the three adjacent third sub-pixels in the same row along the column direction are equal, that is, the widths in the vertical direction are equal. That is, the two third sub-pixels in the above second pixel unit have equal aperture widths along the row direction and equal aperture widths along the column direction. The third sub-pixel 43 in the above first pixel unit and the third sub-pixels 44 in the above second pixel unit have equal aperture widths along the column direction. That is, the area ratio of three adjacent blue sub-pixels is 1:2:1, which is beneficial for realizing uniform display of sub-pixels in the OLED panel.

The third sub-pixels corresponding to the same aperture region (referring to the corresponding dashed box in FIG. 4) of the metal mask are one group of the third sub-pixels, and a spacing between adjacent two groups of the third sub-pixels is equal to the first spacing a between the two third sub-pixels in a same second pixel unit. The spacing between the third sub-pixel 43 in the first pixel unit and the adjacent third sub-pixel 44 in the second pixel unit on the left is b1. The spacing between the third sub-pixel 43 in the first pixel unit and the adjacent third sub-pixel 44 in the second pixel unit on the right is b2. That is, there is a third spacing between the third sub-pixels in the same group, and the third spacing is b1 or b2. The above third spacing is smaller than the second spacing c1 and smaller than the fourth spacing c2. In this way, the arrangement of the third sub-pixels in the same group can be made more compact, which is beneficial for improving the aperture ratio of the third sub-pixels in the same group.

In this embodiment, the third sub-pixel located in the above first pixel unit and two adjacent third sub-pixels belonging to different second pixel units correspond to a same aperture region of a metal mask (referring to the corresponding dashed box in FIG. 4). That is, the third sub-pixels of the same group share one aperture region of the mask, which facilitates further improvement of the aperture ratio of the sub-pixels.

In this embodiment, the line connecting the centers of all groups of third sub-pixels located in the same column is parallel to the column direction of the pixel array, and the line connecting the centers of all groups of third sub-pixels located in the same row is parallel to the row direction of the pixel array. In this way, the jagged display problem of the blue sub-pixels in the column direction existing in the current OLED panel can be avoided, and the display effect of the blue vertical line can be better presented, which is beneficial for improving the display effect of the OLED display apparatus.

Continuing to refer to FIG. 4, in this embodiment, the third sub-pixels in two adjacent rows are arranged in a repeated manner, that is, in the same arrangement manner. That is, the third sub-pixels in two adjacent rows of virtual quadrilaterals are arranged in a repeated manner.

Figure 7:
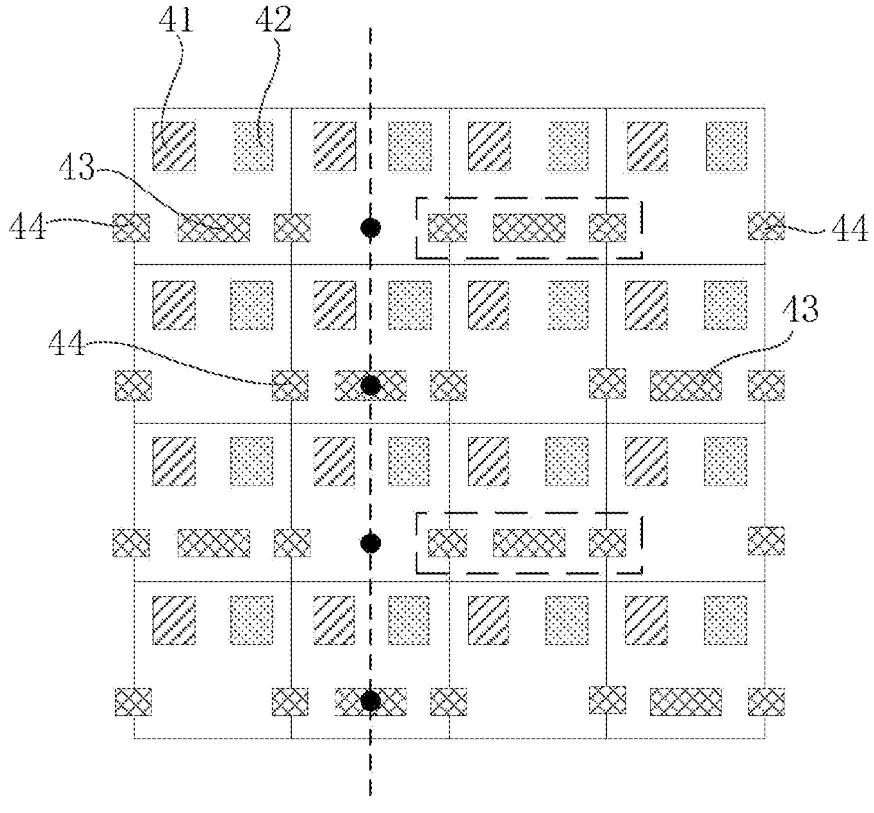
FIG. 7 is a schematic diagram of a pixel arrangement structure disclosed in another embodiment of the present disclosure.

It should be noted that, in other embodiments, as shown in FIG. 7, the third sub-pixels in two adjacent rows may also be arranged in a staggered manner. When the third sub-pixels in two adjacent rows are arranged in the staggered manner, a first symmetry line of the third sub-pixel 43 in the above first pixel unit overlaps with a second symmetry line of the third sub-pixels 44 in the above second pixel unit located in another adjacent row and in a same column. That is, when the third sub-pixels in two adjacent rows are arranged alternately, the symmetry lines of the third sub-pixels in the two pixel units in two adjacent rows overlap. That is, the line connecting the single-point light emitting centers of the third sub-pixels 43 in the first pixel units coincides with the line connecting the single-point light emitting centers of the third sub-pixels 44 in the second pixel units. That is, the single-point light emitting centers are all located on the centerline of the pixel points (referring to the dotted line in FIG. 7), which is beneficial for improving the light emitting display effect of the third sub-pixels such as the blue sub-pixels in the column direction. Correspondingly, in this embodiment, the third sub-pixels of the same group may also share one aperture region of the mask (referring to the corresponding dashed box in FIG. 7), which facilitates further improvement of the aperture ratio of the sub-pixels.

Figure 8:
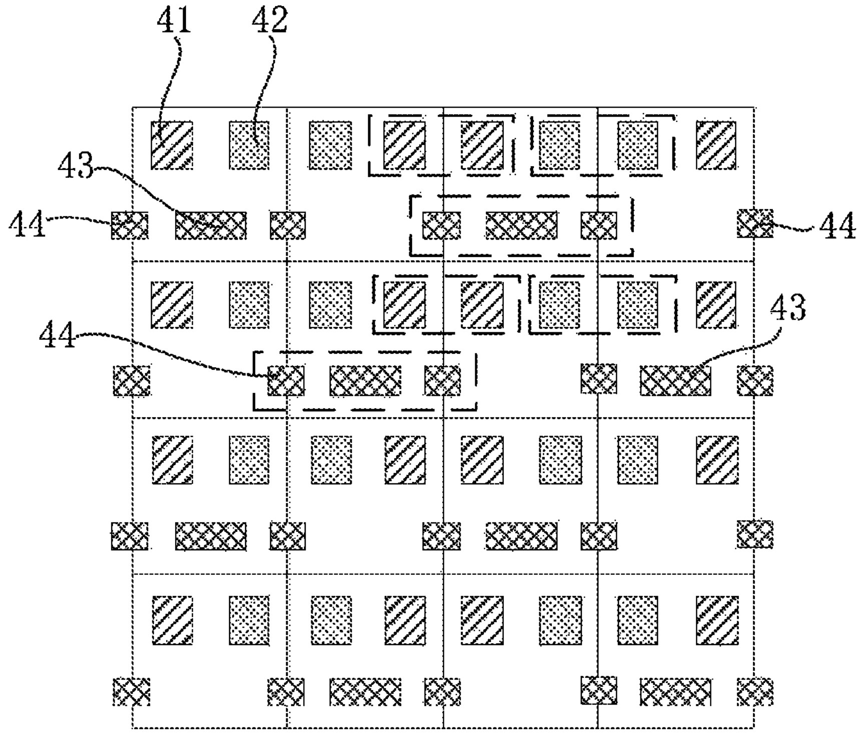
FIG. 8 is a schematic diagram of a pixel arrangement structure disclosed in still another embodiment of the present disclosure.

In another embodiment of the present disclosure, as shown in FIG. 8, the first sub-pixels 41 in the first pixel unit and the second pixel unit adjacent to each other in a same row are arranged mirror-symmetrically with respect to a third symmetry line, and the second sub-pixels 42 in the first pixel unit and the second pixel unit adjacent to each other in a same row are arranged mirror-symmetrically with respect to a fourth symmetry line. The above third symmetry line overlaps with the above fourth symmetry line. That is, the first sub-pixels 41 and the second sub-pixels in the two adjacent pixel units along the row direction are both arranged mirror-symmetrically. In this way, two adjacent first sub-pixels 41 share one aperture region of the mask (referring to the corresponding dashed box in FIG. 8), and two adjacent second sub-pixels 42 share another aperture region of the mask (referring to the corresponding dashed box in FIG. 8). The distance between the sub-pixels of same color is not affected by problems such as color mixing of the metal mask during the vapor deposition process, which also facilitates further improvement of the aperture ratio of the sub-pixels. Moreover, the third sub-pixels of the same group may also share another aperture region of the mask (referring to the corresponding dashed box in FIG. 8).

Figure 9:
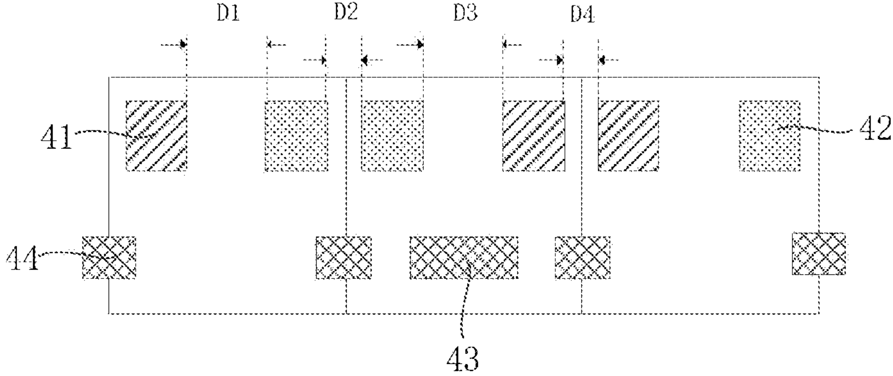
FIG. 9 is a schematic diagram of a local pixel arrangement structure disclosed in still another embodiment of the present disclosure.

In the pixel arrangement structure of this embodiment, referring to FIG. 9, the spacing between two second sub-pixels 42 is D2, the spacing between two first sub-pixels 41 is D4, the spacing between the first sub-pixel 41 and the second sub-pixel 42 in the second pixel unit is D1, and the spacing between the first sub-pixel 41 and the second sub-pixel 42 in the first pixel unit is D3. For the first sub-pixels 41 and the second sub-pixels 42, the spacing (D2 or D4) between sub-pixels of the same color is smaller than the spacing (D1 or D3) between sub-pixels of different colors in the same row. In this way, compared with the embodiments corresponding to FIG. 4 and FIG. 7, the number of contacts between sub-pixels of different colors, i.e., the occupancy of spacing between sub-pixels of different colors, is reduced within the same number of virtual pixel units (referring to 3 pixel units in FIG. 9), which can be used for designing a pixel arrangement with a relatively high aperture area, facilitate an increase in the aperture area of sub-pixels, and thus facilitate improvement of the aperture ratio of the sub-pixels. On the other hand, it is beneficial for reducing the difficulty of manufacturing the metal mask and the difficulty of the vapor deposition process. Preferably, D2 and D4 may be equal, D1 and D3 may also be equal, which is not limited by the present disclosure.

Figure 10:
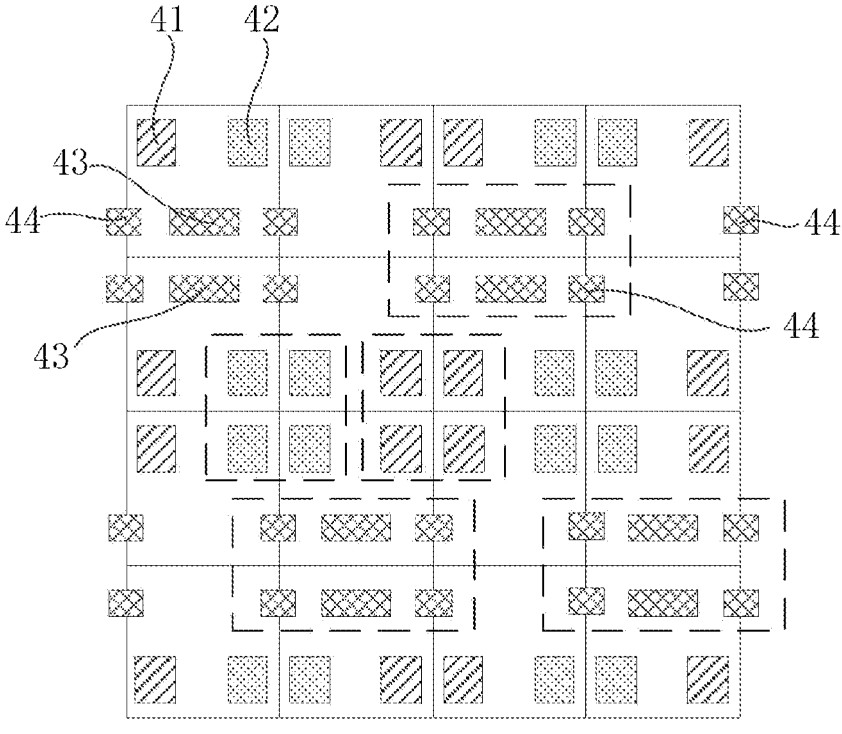
FIG. 10 is a schematic diagram of a pixel arrangement structure disclosed in still another embodiment of the present disclosure.

In another embodiment of the present disclosure, as shown in FIG. 10, the first pixel units in two adjacent rows are mirror-symmetrically arranged with respect to a fifth symmetry line, and the second pixel units in two adjacent rows are mirror-symmetrically arranged with respect to a sixth symmetry line. The fifth symmetry line overlaps with the sixth symmetry line. In this way, four first sub-pixels 41 in two adjacent rows may share one aperture region of the mask (referring to the corresponding dashed box in FIG. 10), four second sub-pixels 42 in two adjacent rows may share another aperture region of the mask (referring to the corresponding dashed box in FIG. 10), and two groups of third sub-pixels (containing 6 third sub-pixels) in two adjacent rows may share another aperture region of the mask (referring to the corresponding dashed box in FIG. 10).

In an optional embodiment, the above-mentioned first spacing a is less than 100 μm. The minimum distance that can be distinguished by human eyes is 100 μm. In this way, even if two third sub-pixels, e.g. blue sub-pixels, in the second pixel unit emit light together to ensure the blue luminance of the pixel, the luminous effect of the second pixel unit can still be consistent with that of the first pixel unit, which ensures the overall display effect of the OLED panel and can present a uniform display.

Exemplarily, in the above mentioned embodiments of the present disclosure, the above first sub-pixels 41 are red sub-pixels, the second sub-pixels 42 are green sub-pixels, and the third sub-pixels are blue sub-pixels. The present disclosure is not limited thereto. It should be noted that, in the above embodiments of the present disclosure, part of the aperture regions of the mask are exemplarily shown in the form of a dotted box, and the drawings of the present disclosure do not show all the aperture regions.

Figure 11:
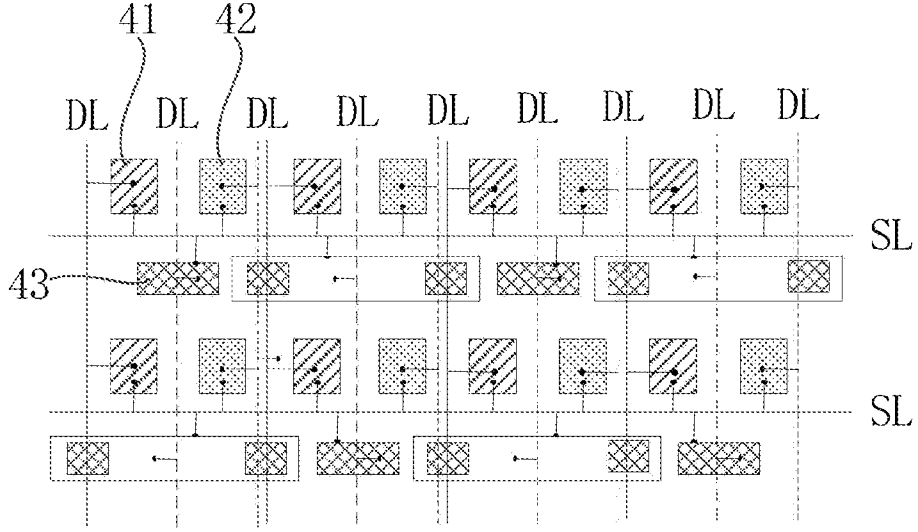
FIG. 11 is a schematic diagram of a driving structure of a display panel disclosed by an embodiment of the present disclosure.

FIG. 11 shows a driving structure of the above display panel. The horizontal solid line is the scanning signal line SL, the vertical dotted line is the data signal line DL, and the scanning signal line SL and the data signal line DL are arranged orthogonally. Referring to FIG. 11, in an optional embodiment, the two third sub-pixels in the above second pixel unit share an anode layer, so that the two third sub-pixels are connected to a same data signal line via the anode layer, thus enabling one data signal line to drive the two third sub-pixels to light up together, so that the two third sub-pixels in the second pixel unit are symmetrically arranged separately but light up together. This helps to reduce the complexity of the layout of the driving circuit and the circuit structure is simple. In other embodiments, the driving structure can also be set such that the two blue sub-pixels are driven separately by two data signal lines. Alternatively, the two blue sub-pixels may be separately connected and driven by one data signal line.

In the manufacturing process of OLED panels, it is necessary to add a columnar spacer (Photo Spacer, PS for short, also called a support pillar) with a certain thickness between two substrates before the two substrates are boxed to maintain the thickness of the box (Cell Gap). In the embodiments of the present disclosure, the support pillar may be placed in the space between the two third sub-pixels in the second pixel units along the row direction. With regard to the technical solution corresponding to FIG. 1, the support pillar is arranged in the space between every two sub-pixels of different colors in the row direction. Since the spacing between the two third sub-pixels in the second pixel unit is greater than the spacing between every two sub-pixels of different colors in the row direction of the pixel array in FIG. 1, compared with the corresponding technical solution in FIG. 1, the available space for the support pillar is significantly increased, which facilitates the placement of the support pillar, thus facilitating the improvement of the compressive capacity of the support pillar and reducing the risk of crushing the support pillar.

Some embodiments of the present disclosure further provide a metal mask. The metal mask is used for manufacturing the pixel arrangement structure disclosed in any of the above embodiments. For detailed structural features and advantages of the pixel arrangement structure, reference may be made to the description of the above-mentioned embodiments, which will not be repeated here. The metal mask includes a plurality of aperture regions, each corresponding to sub-pixels of a same color. One group of third sub-pixels located within the same aperture region includes one third sub-pixel in the first pixel unit and two third sub-pixels belonging to different second pixel units.

Some embodiments of the present disclosure further provide a display panel, and the display panel includes the pixel arrangement structure disclosed in any of the above embodiments. For detailed structural features and advantages of the pixel arrangement structure, reference may be made to the description of the above-mentioned embodiments, which will not be repeated here.

Some embodiments of the present disclosure further provide a display apparatus, and the display apparatus includes the display panel disclosed in the above embodiment.

The display apparatus provided by the embodiments of the present disclosure may be any apparatus that displays contents regardless of whether they are dynamic (for example, video) or fixed (for example, still images), and regardless of whether they are texts or images. More particularly, it is contemplated that the described embodiments may be implemented in or associated with a variety of electronic apparatuses. The variety of electronic apparatuses may include, for example, but not limited to, a mobile phone, a wireless device, a personal data assistant (PDA), a handheld or portable computer, a GPS receiver/navigator, a camera, a MP4 video player, a camcorder, a games console, a watch, a clock, a calculator, a television monitor, a flat panel display, a computer monitor, an automotive display (e.g., an odometer display, etc.), a navigator, a cockpit control and/or display, a display for camera views (e.g., a display for a rear-view camera in a vehicle), an electronic photo, an electronic billboard or sign, a projector, an architectural structure, a packaging and an aesthetic structure, etc.

To sum up, the pixel arrangement structure, the metal mask, the display panel and the display apparatus disclosed by the present disclosure have at least the following advantages.

The pixel arrangement structure disclosed by the embodiments of the present disclosure is formed by arranging two kinds of pixel units alternately, and the number and structure of the third sub-pixels in the two kinds of pixel units are different. The aperture area of the third sub-pixel in the first pixel unit is greater than the aperture area of each third sub-pixel in the second pixel unit. The same group of adjacent third sub-pixels corresponding to two pixel units may share the same aperture region of the metal mask, which is beneficial for improving the aperture ratio of pixels in the OLED panel, thereby facilitating the improvement of the brightness and service life of the OLED panel.

On the other hand, the line connecting the single-point light emitting centers of the third sub-pixels in the first pixel units coincides with the line connecting the single-point light emitting centers of the third sub-pixels in the second pixel units, which can solve the jagged display problem of the blue sub-pixels in the column direction existing in the current OLED panel, thereby improving the display effect of the OLED panel.

The advantages of the above metal mask, display panel and display apparatus over the related art are the same as those of the above pixel arrangement structure, and will not be repeated here.

The above content is a further detailed description of the present disclosure in conjunction with specific embodiments, and it cannot be considered that the specific implementation of the present disclosure is limited to these descriptions. For those of ordinary skill in the art, without departing from the concept of the present disclosure, some simple deductions or substitutions may be made, all of which should be regarded as falling within the scope of protection of this disclosure.

What is claimed is:

1. A pixel arrangement structure, comprising: a plurality of first pixel units and a plurality of second pixel units, wherein the first pixel units and the second pixel units are arranged alternately in a row direction, each of the first pixel units comprises one first sub-pixel, one second sub-pixel and one third sub-pixel; and each of the second pixel units comprises one first sub-pixel, one second sub-pixel and two third sub-pixels; and wherein an aperture area of the third sub-pixel in the first pixel unit is greater than an aperture area of each third sub-pixel in the second pixel unit, a first spacing exists between the two third sub-pixels in the second pixel unit, a second spacing exists between the first sub-pixel and the second sub-pixel in the second pixel unit, the first spacing is greater than the second spacing; and the third sub-pixel located in the first pixel unit and two adjacent third sub-pixels belonging to different second pixel units correspond to a same aperture region of a metal mask.

2. The pixel arrangement structure according to claim 1, wherein the aperture area of a single third sub-pixel in the first pixel unit is greater than or equal to a sum of the aperture areas of the two third sub-pixels in the second pixel unit.

3. The pixel arrangement structure according to claim 2, wherein the aperture areas of the two third sub-pixels in the second pixel unit are equal, and the aperture area of the single third sub-pixel in the first pixel unit is equal to the sum of the aperture areas of the two third sub-pixels in the second pixel unit.

4. The pixel arrangement structure according to claim 1, wherein the two third sub-pixels in the second pixel unit have equal aperture widths along the row direction and equal aperture widths along a column direction; the third sub-pixel in the first pixel unit and the third sub-pixels in the second pixel unit have equal aperture widths along the column direction, and an aperture width of the third sub-pixel in the first pixel unit along the row direction is twice the aperture width of the third sub-pixel in the second pixel unit along the row direction.

5. The pixel arrangement structure according to claim 1, wherein the third sub-pixels corresponding to the same aperture region of the metal mask are one group of the third sub-pixels, and a spacing between adjacent two groups of the third sub-pixels is equal to a spacing between the two third sub-pixels in a same second pixel unit.

6. The pixel arrangement structure according to claim 1, wherein the third sub-pixels in two adjacent rows are arranged in a same manner or in an interleaved manner.

7. The pixel arrangement structure according to claim 5, wherein a third spacing exists between the third sub-pixels in a same group, and the third spacing is smaller than the second spacing.

8. The pixel arrangement structure according to claim 6, wherein a first symmetry line of the third sub-pixel in the first pixel unit overlaps with a second symmetry line of the third sub-pixels in the second pixel unit located in another adjacent row and in a same column.

9. The pixel arrangement structure according to claim 1, wherein the first sub-pixels in the first pixel unit and the second pixel unit adjacent to each other in a same row are arranged mirror-symmetrically with respect to a third symmetry line, the second sub-pixels in the first pixel unit and the second pixel unit adjacent to each other in a same row are arranged mirror-symmetrically with respect to a fourth symmetry line, the third symmetry line overlaps with the fourth symmetry line; and a spacing between sub-pixels of a same color in a same row is smaller than a spacing between sub-pixels of different colors in the same row.

10. The pixel arrangement structure according to claim 1, wherein the two third sub-pixels in the second pixel unit share an anode layer so that the two third sub-pixels are connected to a same data signal line via the anode layer.

11. The pixel arrangement structure according to claim 1, wherein the first spacing is less than 100 μm.

12. The pixel arrangement structure according to claim 1, wherein the third sub-pixel is a blue sub-pixel.

13. A metal mask for manufacturing a pixel arrangement structure, wherein the pixel arrangement structure comprises:

a plurality of first pixel units and a plurality of second pixel units, wherein the first pixel units and the second pixel units are arranged alternately in a row direction, each of the first pixel units comprises one first sub-pixel, one second sub-pixel and one third sub-pixel; and each of the second pixel units comprises one first sub-pixel, one second sub-pixel and two third sub-pixels; and wherein an aperture area of the third sub-pixel in the first pixel unit is greater than an aperture area of each third sub-pixel in the second pixel unit, a first spacing exists between the two third sub-pixels in the second pixel unit, a second spacing exists between the first sub-pixel and the second sub-pixel in the second pixel unit, the first spacing is greater than the second spacing; and the third sub-pixel located in the first pixel unit and two adjacent third sub-pixels belonging to different second pixel units correspond to a same aperture region of a metal mask, wherein the metal mask comprises:

a plurality of aperture regions, each corresponding to sub-pixels of a same color; wherein one group of third sub-pixels located within a same aperture region comprises one third sub-pixel in the first pixel unit and two third sub-pixels belonging to different second pixel units.

14. A display panel, comprising a pixel arrangement structure, wherein the pixel arrangement structure comprises:

a plurality of first pixel units and a plurality of second pixel units, wherein the first pixel units and the second pixel units are arranged alternately in a row direction, each of the first pixel units comprises one first sub-pixel, one second sub-pixel and one third sub-pixel; and each of the second pixel units comprises one first sub-pixel, one second sub-pixel and two third sub-pixels; and wherein an aperture area of the third sub-pixel in the first pixel unit is greater than an aperture area of each third sub-pixel in the second pixel unit, a first spacing exists between the two third sub-pixels in the second pixel unit, a second spacing exists between the first sub-pixel and the second sub-pixel in the second pixel unit, the first spacing is greater than the second spacing; and the third sub-pixel located in the first pixel unit and two adjacent third sub-pixels belonging to different second pixel units correspond to a same aperture region of a metal mask.

15. A display apparatus, comprising the display panel according to claim 14.

16. The display panel according to claim 14, wherein the aperture area of a single third sub-pixel in the first pixel unit is greater than or equal to a sum of the aperture areas of the two third sub-pixels in the second pixel unit.

17. The display panel according to claim 16, wherein the aperture areas of the two third sub-pixels in the second pixel unit are equal, and the aperture area of the single third sub-pixel in the first pixel unit is equal to the sum of the aperture areas of the two third sub-pixels in the second pixel unit.

18. The display panel according to claim 14, wherein the two third sub-pixels in the second pixel unit have equal aperture widths along the row direction and equal aperture widths along a column direction; the third sub-pixel in the first pixel unit and the third sub-pixels in the second pixel unit have equal aperture widths along the column direction, and an aperture width of the third sub-pixel in the first pixel unit along the row direction is twice the aperture width of the third sub-pixel in the second pixel unit along the row direction.

19. The display panel according to claim 14, wherein the third sub-pixels corresponding to the same aperture region of the metal mask are one group of the third sub-pixels, and a spacing between adjacent two groups of the third sub-pixels is equal to a spacing between the two third sub-pixels in a same second pixel unit.

20. The display panel according to claim 14, wherein the third sub-pixels in two adjacent rows are arranged in a same manner or in an interleaved manner.

* * * * *